US007015822B2

(12) United States Patent
Heiser, Jr. et al.

(10) Patent No.: US 7,015,822 B2
(45) Date of Patent: Mar. 21, 2006

(54) BATTERY CAPACITY AND USAGE SYSTEM

(75) Inventors: Arthur J. Heiser, Jr., Newport Beach, CA (US); James F. Calvagna, Anaheim, CA (US)

(73) Assignee: Duffield Marine, Inc., Newport Beach, CA (US)

( * ) Notice: Subject to any disclaimer, the term of this patent is extended or adjusted under 35 U.S.C. 154(b) by 23 days.

(21) Appl. No.: 10/872,798

(22) Filed: Jun. 21, 2004

(65) Prior Publication Data

US 2004/0227491 A1 Nov. 18, 2004

Related U.S. Application Data

(63) Continuation of application No. 10/213,469, filed on Aug. 7, 2002, now abandoned.

(51) Int. Cl.
*G08B 21/00* (2006.01)

(52) U.S. Cl. ............................ 340/636.1; 340/636.12; 340/636.16; 320/137; 320/FOR. 148; 307/10.1

(58) Field of Classification Search ............ 340/636.1, 340/636.12, 636.16; 320/137, FOR. 148; 307/10.1

See application file for complete search history.

(56) References Cited

U.S. PATENT DOCUMENTS

| | | | |
|---|---|---|---|
| 4,028,616 | A | 6/1977 | Stevens |
| 4,949,046 | A | 8/1990 | Seyfang |
| 5,587,924 | A | 12/1996 | Lossi |
| 6,242,891 | B1 | 6/2001 | Parsonage |

OTHER PUBLICATIONS

Duffy 16 Electrical Classic Brochure (4 pages).
Duffy-Cat 16 Electrical Brochure (4 pages).
Duffy 17 Electrical (2 pages).
Duffy 18 Electrical (4 pages).

*Primary Examiner*—Julie Bichngoc Lieu
(74) *Attorney, Agent, or Firm*—Stetina Brunda Garred & Brucker

(57) ABSTRACT

A battery capacity and usage system, applied to an electric powered boat. A battery monitor is controlled by a micro-controller which includes a non-volatile memory for storing a lookup table. The lookup table comprises a database of characteristics of various batteries, including a relationship between the capacity and the charged voltage, the driving current and remaining hours of usage. The load of the battery is measured by a hall effect device. By monitoring the current micro-controller calculates the remaining time of the battery is obtained from the lookup table and displays the results on a digital readout installed on dashboard of the electric powered boat.

12 Claims, 3 Drawing Sheets

FIG. 1
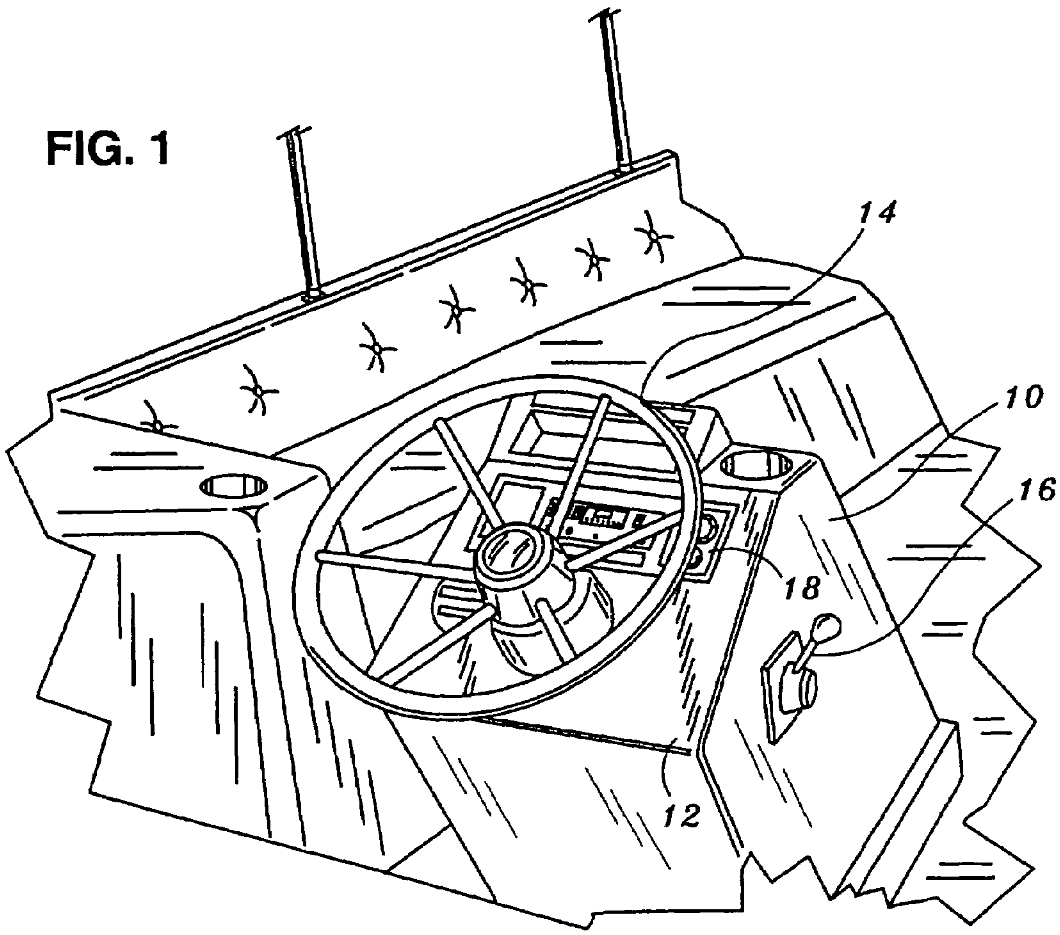
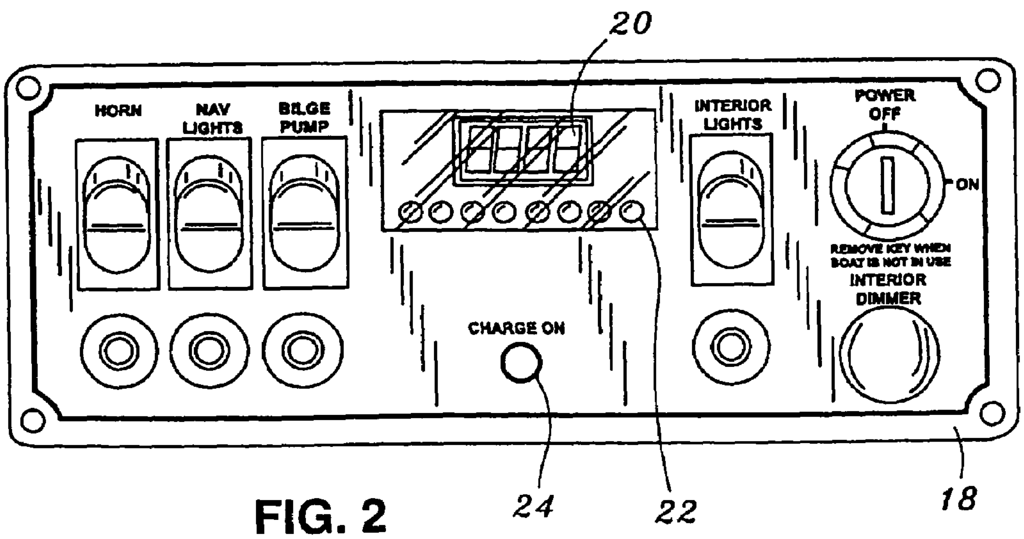
FIG. 2

BATTERY CAPACITY AND USAGE SYSTEM

CROSS REFERENCE TO RELATED APPLICATION

This application is a continuation application of application Ser. No. 10/213,469, filed, Aug. 7, 2002

STATEMENT RE: FEDERALLY SPONSORED RESEARCH/DEVELOPMENT (Not Applicable)

BACKGROUND OF THE INVENTION

The present invention relates to an electric battery capacity and usage system, and more particularly, to a battery capacity/usage system particularly useful in electric powered boats.

Electric powered boats, like many other electric powered vehicles, require an electric power system, which typically includes one or more onboard rechargeable storage batteries. It is important to monitor the capacity of the batteries in real time to avoid an unexpected or unwanted loss of power resulting in a shutdown of the electric motor during operation. Safety and convenience concerns dictate the importance of having a battery "fuel gage," so that boat occupants are not stranded, or unable to maneuver away from danger.

Prior art electric powered boat technology, a volt meter is typically employed to monitor the residual voltage supply of the batteries. The voltmeter indicates the remaining charge on the batteries based upon voltage alone without time indication. Alternatively, a current measuring type meter may be employed to monitor the battery capacity. In the current measuring type meter, wiring must be interrupted by shunts, and Peukert's Equation is used to estimate the remaining time.

The information supplied to a boat operator when using a voltmeter indicator may be unreliable. For example, when using a 36V battery, the battery is only effective to drive the electric motor within the voltage range of about 32V to about 36V. Under this circumstance, it is possible that an operator may have insufficient battery power to pull the boat in shore when the meter shows that the battery is low, but not empty. In this regard, many prior art and configurations can only measure the remaining time under a full load condition. In such a configuration, the exact remaining time for using the battery when the boat is driven in a slower speed cannot be ascertained.

Also, the prior art metering systems for determining battery charge are costly and difficult to install. In addition, the wire leading to the battery requires the placement of an intervening shunt resister exposing metal components to the elements. Exposed metal is subject to corrosive forces, particularly in a sea environment. Also, a different voltmeter is required for different types of batteries.

Therefore, it would be desirable to provide a universal battery capacity monitor for use in electric boats that can provide a true reading of the time remaining before loss of power and motor shutdown. Furthermore, it would be desirable to provide battery monitor that is easy to install, and which will be more resistant to corrosive forces encountered in boating environments.

BRIEF SUMMARY OF THE INVENTION

A battery capacity/usage system applied to a vehicle such as an electric boat is provided by the invention. The battery capacity/usage system includes a Hall effect sensor, micro-controller, a light display and a readout meter. A lookup table is stored in a memory of the micro-controller. The look-up table has a database of particular battery characteristics, including the total capacity for various input voltage, the remaining hours for various loads. Various kinds of batteries are pre-tested to obtain the characteristics written in the database before installing the system in the electric boat. Each time when the batteries are charged/recharged, the battery capacity/usage system is reset with a full scale of capacity. The effective time for the battery pack is obtained from the lookup table, and the load current is monitored by the Hall effect sensor. With the data of the using time and load current, the remaining hours of the battery pack for certain driving speed can be obtained from the look-up table. The remaining hours are displayed on the readout meter, or expressed by the light indicator.

A light display and a digital read out are further included in the battery capacity/usage system. When the battery pack is full, all of the light elements of the light display are on. As the power of the battery is consumed and reduced, single light elements turn off in descending order. When the capacity of the battery pack drops to zero, all the light elements turn off.

The digital readout aids the operator by providing a reading of the calculated remaining time of battery usage. For example, the remaining hours that the battery is still effective are displayed. Because of the characteristics of the batteries are pre-stored in a lookup table, by measuring the driving current, the remaining capacity of the battery pack can be obtained from the micro-controller. In addition, the digital readout can also drive an analog meter as required.

It should be noted and understood that with respect to the embodiments of the present invention, the materials suggested may be modified or substituted to achieve the general overall resultant high efficiency. The substitution of materials or dimensions remain within the spirit and scope of the present invention.

BRIEF DESCRIPTION OF THE DRAWINGS

Other objects advantages of the invention will become more apparent from the study of the following specification when viewed in light of the accompanying drawing, in which:

FIG. 1 shows the control console and the dashboard of an electric powered boat;

FIG. 2 shows a dashboard display of an electric powered boat of the present invention;

DETAILED DESCRIPTION OF THE INVENTION

Figure 3:
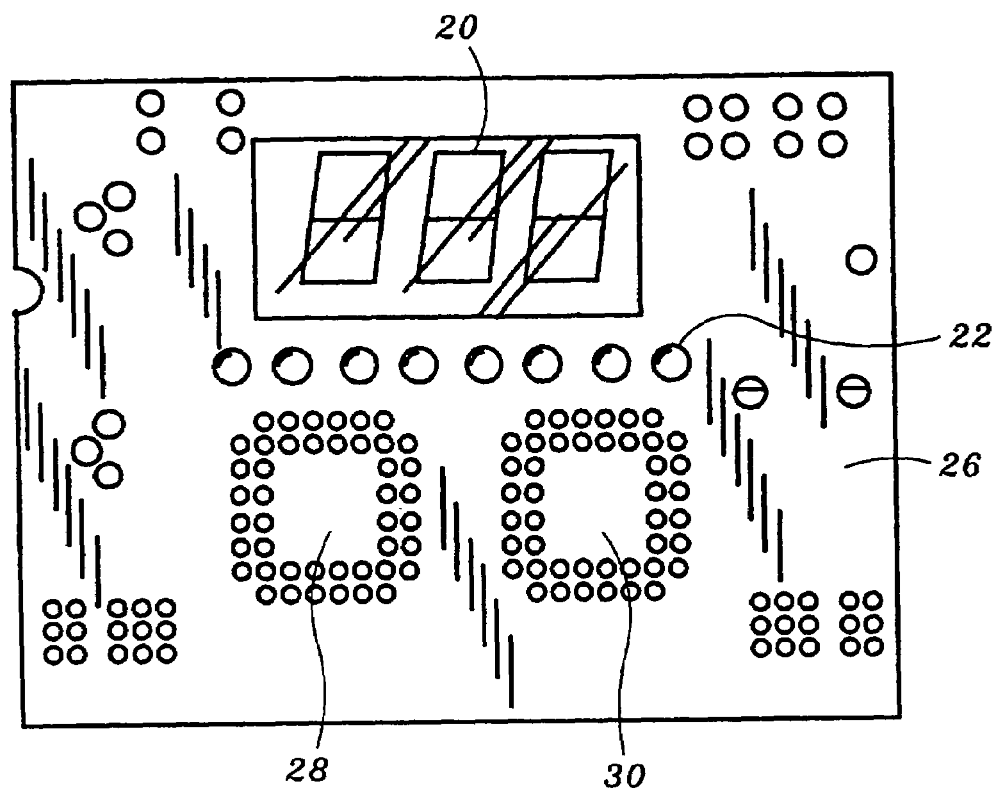
FIG. 3 shows the digital read out of the battery capacity/usage system of the invention.

The detailed description as set forth below in connection with the appended drawings is intended as a description of the presently preferred embodiments of the present invention, and are not intended to represent the only form in which the present invention may be constructed or utilized. The description sets forth functions and sequence of steps for constructing and operating the invention in connection with the illustrated embodiments. It is understood, however, the same or equivalent functions and sequences may be accomplished by different embodiments and that they are also intended to be encompassed within the spirit and scope of this invention.

Referring particularly to FIG. 1, the control console 10 and the dashboard 12 of an electric boat are shown. The control console 10 includes a steering wheel 14 for maneuvering the electric powered boat and a throttle 16 for placing the boat in forward or reverse and adjusting the speed of the boat. Also provided on the console 10 within dashboard 12, is the dashboard display 18. Dashboard display 18 is shown in more detail in FIG. 2.

Referring particularly to FIG. 2, the dashboard display 18 includes a digital readout 20. Immediately below the digital readout 20, light indicators 22 including several light elements. The light elements of the light indicators 22 preferably comprise light emitting diodes, but may also include light bulbs. The remaining time of battery usage is shown in readout 20. The light indicators 22 gives the driver an idea of the percentage of the consumed power of the battery storage, and also the remaining capacity of the battery pack. Under the light indicators 22, a charge indicator 24 is installed to display the charging mode of the battery. For example, charge indicator 24 is lighted when the battery pack is charging. The charge indicator 24 is preferably a light bulb, but may also be an LED.

The display 18 of the electric power boat is user friendly and provides not only the time remaining on the charge through readout 20, but also the relative percentage of battery storage utilized through light indicators 22. It is important for an operator to have both levels of information as the time remaining shown in the readout 20 is calculated based upon the speed of the boat at that time. The LED indicators 22 provide the relative drainage of the remaining power irrespective of the speed of the boat.

In FIG. 3, a PC board 26 is shown which carries the digital readout 20 and the light indicators 22. It is contemplated by the present invention that the PC board 26 would be installed under the dashboard display 18 with the visual components, namely the display readout 20 and the light indicators 22 being visible through a window of the dashboard display 18. The PC board 26 shown in FIG. 3, includes footprint 28 and 30 for receiving a memory module and a micro-controller.

Figure 4:
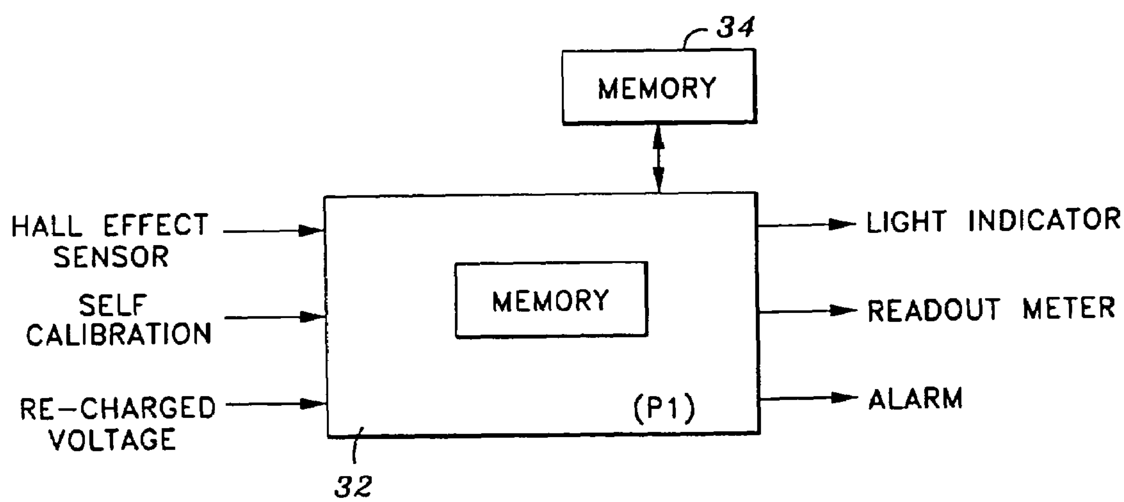
FIG. 4 shows a block diagram of a micro-controller for battery monitoring and display of the present invention.

Referring particularly to FIG. 4, the block diagram is showing the function of the battery capacity and usage system of the present invention. In particular, a micro-controller 32 (i.e., microprocessor) is in electrical communication with a memory device 34. The memory device 34 is preferably a flash memory device, but may comprise any like memory storage device. After the battery pack is fully charged/recharged, a supply voltage of the battery pack is input to the micro-controller 32, which then performs a self-calibration operation to reset the capacity of the battery pack to a full scale in the micro-controller's 32 non-volatile memory. Meanwhile, all the light elements 22 are on, and the total effective time versus various load current corresponding to the supply voltage can be obtained from a lookup table embedded in said memory 34. The apparatus to measure the voltage of the battery pack includes the standard voltage divider sensor. Further, the voltage is only measured when the charging mode of the battery pack is over. The voltmeter can be built external to the battery capacity/usage system. The problems occurring to the conventional structure that has the built-in voltmeter can thus be avoided.

Empirical data of characteristics of various batteries are stored in the memory 34 lookup table (i.e., data table). In the lookup table, a database of characteristics for various batteries, including the total capacity for a given voltage and the remaining time with a given load. The batteries are pretested before installation, and the empirical data of the characteristics are saved in the database. The capacity of the battery is a function of effective time and driving current. After obtaining the total capacity for a given voltage, one can measure the effective time of the battery by applying a driving current. A different effective time of the battery is obtained by applying a second driving current. Similarly, different effective time of the battery can be obtained by applying different driving currents. This data is the empirical data of characteristics of the battery saved in the lookup table of memory 34.

In the embodiment of the present invention, the effective time of the battery is measured every time when the driving current is increased with an increment of 0.1 Ampere. When the vehicle initially starts with a certain speed, by inputting the load (the driving current) to the micro-controller 32, the effective hours of the battery pack can be found from the lookup table and displayed on the display readout 20. When the vehicle initially starts, all the light elements 22 are on. Each of the light elements 22 extinguishes as a certain percentage of the capacity is consumed. Preferably, the number of the light elements 22 is 8. When half capacity of the battery pack is consumed, four of the light elements 22 are on, and four are off. Each light element 22 indicate 12.5% of the full power. In addition to the light indicator 22, the display readout 20 shows the exact remaining hours of the battery pack. As mentioned above, the remaining hours of the battery pack is a function of the driving current. That is, when the driving current of the vehicle is changed, the remaining hours of the battery pack is different. Therefore, the driving current is detected and input to the micro-controller 34 whenever it is changed. The exact remaining hours corresponding to the driving current can be obtained from the lookup table of memory 34. The data includes the total capacity versus charged voltage, and the remaining time versus the load current for various battery pack. When the vehicle is cruising, the cruising time is continuously counted and fed into the micro-controller 34. From the lookup table, the remaining hours at any moment when the vehicle is cruising is monitored by inputting the cruising time and the load for driving the vehicle. The load current can be detected from a Hall effect sensor 36 (shown in FIG. 5), while the cruising time of the vehicle, that is, the running time for the battery pack can be easily counted by a counting or timing apparatus built in the micro-controller 32. Again, the remaining capacity of the battery pack is displayed in terms of remaining hours on the digital readout 20, and the remaining capacity percentage is expressed by the numbers of the light elements 22 which are on.

In addition, a telephone port or other data entry port can be used to download performance of the battery pack for adding to the database or for trouble shooting. Further, as shown in FIG. 4, an alarm such as a flashing light or a speaker can be installed and coupled to the micro-controller 32. When the capacity of the battery pack drops to a certain level, the alarm is on to warn the driver.

Figure 5:
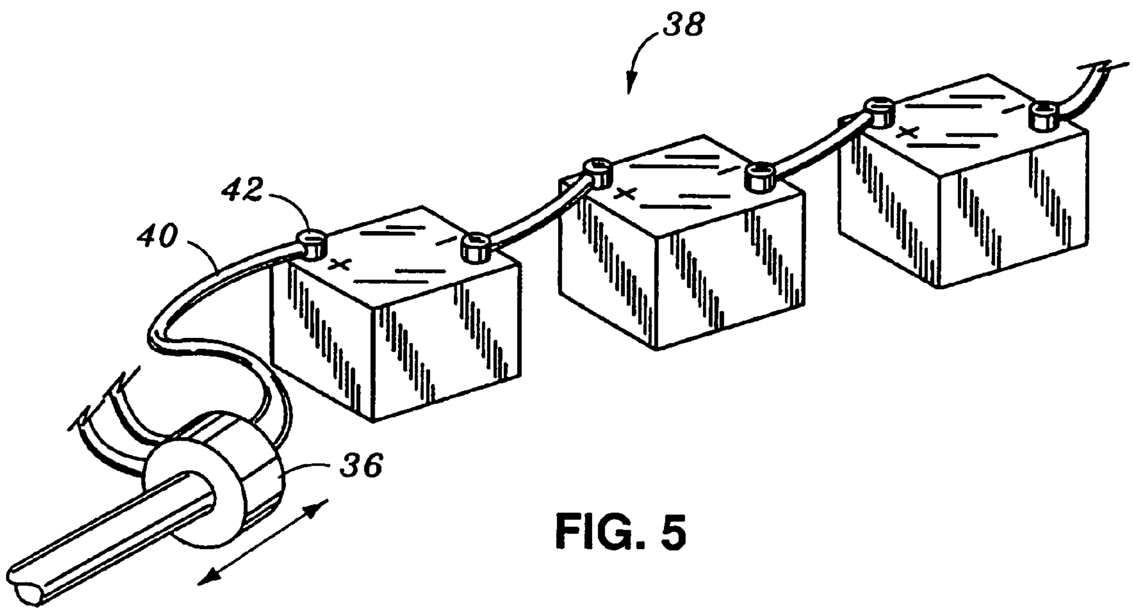
FIG. 5 shows a multiple battery configuration employing a Hall effect sensor of the present invention.

FIG. 5 shows the Hall effect apparatus 36 to measure the load of the battery pack 38. In this embodiment, a Hall effect sensor 36 is placed over a wire 40 connected to a positive electrode of the battery pack 42 which includes a plurality of batteries connected in series. As shown in FIG. 4, the output of the Hall effect sensor 36 is connected to the micro-controller 32 to input the detected driving current of the battery pack. Although the configuration of FIG. 5 shows three batteries in series, it is contemplated by the present invention that the batteries may be multiple configuration and may be comprised of any battery type system currently available.

It is contemplated by the present invention that although the disclosure indicates that the invention will be particularly useful with respect to electric powered boats, and is recognized that the present invention can be equally utilized with other electric powered vehicles. For example, electric cars, electric scooters, electric bicycles and other electric powered vehicles may equally benefit on the technology of the present invention.

Indeed, each of the features and embodiments described herein can be used by itself, or in combination with one or more of the other features and embodiments described herein. Thus, the invention is not to be limited by the illustrated embodiments but is to be defined by the following claims when read in the broadest reasonable manner to preserve the validity of the claims Additional modifications and improvements of the present invention may also be apparent to those skilled in the art. Thus, a particular combination of parts described and illustrated herein is intended to represent only certain embodiments of the present invention, and is not intended to serve as limitations of alternative devices within the spirit and scope of the invention.

The invention claimed is:

1. A battery capacity and usage system, for use in an electric powered vehicle to monitor battery capacity and to convey the information to the vehicle operator comprising:

a microprocessor, comprising:

- a first input in electrical communication with a current sensor for monitoring the current load on the battery power supply;
- a second input in electrical communication with a voltage sensor to measure an initial capacity of the battery;
- a timing apparatus to continuously calculate an application time of the load; and
- a first output in electric communication with a peripheral device for displaying information; and a memory device in electric communication with said microprocessor having an embedded data table of pretested battery characteristics including the relationship between the application time of the battery, the remaining battery capacity, the current load of the battery and the corresponding remaining hours of the battery usage;

wherein when said microprocessor receives the load current and the initial capacity of the battery, the data table of the memory device is retrieved to determine and display an available operation time of the battery, the microprocessor further continuously calculates the application time of the load and the load current to continuously update and display the available operation time of the battery usage.

2. The battery capacity and usage system of claim 1, said microprocessor further including a second output in electrical communication with a plurality of light elements to display the remaining percentage of the battery usage determined in accordance with the battery characteristics in the data table.

3. The battery capacity and usage system of claim 2, wherein said light elements comprise at least two LED's, and each LED representing a percentage of capacity remaining on the battery.

4. The battery capacity and usage system of claim 1 wherein said current sensor is a Hall effect device.

5. The battery capacity and usage system of claim 1 wherein said peripheral device is a digital display.

6. The battery capacity and usage system of claim 1 wherein said microprocessor includes a second output in electrical communication with an alarm device for indicating low battery charge.

7. The battery capacity and usage system of claim 6 wherein said alarm device is a speaker.

8. The battery capacity and usage system of claim 6 wherein said alarm device is a tone generator.

9. The battery capacity and usage system of claim 6 wherein said alarm system comprises a light element.

10. The battery capacity and usage system of claim 1 wherein said microprocessor includes a second output in electrical communication with a light element for indicating that the battery is being recharged.

11. The battery capacity and usage system of claim 1 wherein the voltage sensor includes an external voltmeter.

12. A method of monitoring battery capacity and usage time remaining for use with electric powered vehicles comprising the following steps:

- pre-testing the battery to obtain a lookup table showing a relationship between an initial voltage level and an initial available charge of the battery, and a relationship between a load current applied to the battery and a remaining usage time of the battery;
- measuring the initial voltage level of the battery;
- resetting the battery to a full scale with the initial battery charge;
- measuring the current load applied on the battery power supply and determining the available usage time of the battery according to the lookup table;
- continuously counting an application time of the load and updating and displaying the remaining usage time of the battery according to the lookup table.

* * * * *